(12) United States Patent
Kunihiro

(10) Patent No.: US 6,556,416 B2
(45) Date of Patent: Apr. 29, 2003

(54) VARIABLE CAPACITOR AND A VARIABLE INDUCTOR

(75) Inventor: Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/206,528

(22) Filed: Jul. 26, 2002

(65) Prior Publication Data

US 2003/0063427 A1 Apr. 3, 2003

(30) Foreign Application Priority Data

Aug. 27, 2001 (JP) ......................................... 2001-255750

(51) Int. Cl.$^7$ ................................................. H01G 5/00
(52) U.S. Cl. ..................................... 361/277; 361/298.4
(58) Field of Search .............................. 361/277, 278, 361/292, 298.4, 299.2

(56) References Cited

U.S. PATENT DOCUMENTS

2002/0044022 A1 * 4/2002 Shintani et al. ............. 333/100

FOREIGN PATENT DOCUMENTS

| JP | 64-16669 | 1/1989 |
|---|---|---|
| JP | 5-152161 | 6/1993 |
| JP | 6-69071 | 3/1994 |
| JP | 11-176987 | 7/1999 |

OTHER PUBLICATIONS

Yamamoto et al, "A 3.2–V Operation Single–Chip AlGaAs/GaAs HBT MMIC Power Amplifier for GSM900/1800 Dual–Band Applications", *IEE MTT–S International Microwave Symposium Digest*, pp. 1397–1400.

* cited by examiner

Primary Examiner—Anthony Dinkins
(74) Attorney, Agent, or Firm—Choate, Hall & Stewart

(57) ABSTRACT

A variable capacitor is formed by a multilayer circuit board having a plurality of dielectric layers; a first conductive plate, provided within the multilayer circuit board, for serving as one electrode of the variable capacitor; a second conductive plate, provided within the multilayer circuit board, for serving as the other electrode of the variable capacitor; a plurality of third conductive plates provided between the first conductive plate and the second conductive plate; and a plurality of switching means provided for grounding the third conductive plates selectively.

6 Claims, 12 Drawing Sheets

1: MULTILAYER CIRCUIT BOARD
2: SEMICONDUCTOR CHIP
3: GROUNDING TERMINAL
4: GROUNDING LEAD
11: FIRST LAMINATE SECTION
12: SECOND LAMINATE SECTION
13: THIRD LAMINATE SECTION
15a, 15b: CONNECTION TERMINAL
16a, 16b: CONNECTION TERMINAL
21, 22, 23: INSULATING LAYER
24, 25, 26: INNER CONDUCTIVE LAYER
27, 28: OUTER CONDUCTIVE LAYER
29: VIA HOLE
30: VARIABLE CAPACITOR
31, 32, 33, 34: CONDUCTIVE PLATE
40: VARIABLE INDUCTOR
41: TRANSMISSION LINE
42, 43: CONDUCTIVE PLATE
100: RF CIRCUIT MODULE $$L \cong \frac{Z_0 \cdot l}{\lambda_g \cdot f}$$

| SW1 | SW2 | SW1' | SW2' | Z(Ω) |
|-----|-----|------|------|------|
| ON  | OFF | ON   | OFF  | 3.3+j1.5 |

| SW1 | SW2 | SW1' | SW2' | Z(Ω) |
|-----|-----|------|------|------|
| OFF | ON  | OFF  | OFF  | 11+j5.7 |

VARIABLE CAPACITOR AND A VARIABLE INDUCTOR

BACKGROUND OF THE INVENTION

1. Field of the Invention

The present invention relates to a variable capacitor, a variable inductor, and a radio frequency circuit module, and additionally relates to a variable capacitor and a variable inductor suitable for use as passive elements in a radio frequency circuit module, and to radio frequency circuit module having this variable capacitor and variable inductor.

2. Related Art

Radio frequency circuits used in radio communications devices such as portable telephones are formed by a large number of components, such as semiconductor transistors, IC chips, and passive circuit, elements such as resistors, capacitors, and inductors. In order to achieve compactness in such apparatuses, modularization techniques, which integrate those components amenable to such integration on one substrate or within one package, is widely used. For example, in an RF amplifier module used in a portable telephone, a transistor which amplifies a high-frequency (radio frequency, RF) signal, an input impedance matching circuit for the purpose of supplying an RF signal to the transistor efficiently, and an output impedance matching circuit for the purpose of extracting the amplified RF signal with good efficiency are formed on one substrate. A multilayer board made of glass-ceramic or resin is often used as the board for this circuitry.

In this type of RF circuit module, in the case in which the impedance of a matching circuit includes a deviation from the designed value because of variations in the process of fabricating the board or transistor, it is generally necessary to adjust the impedance after fabrication. Given this situation, technology has been proposed in the past to enable adjustment of the impedance.

For example, in Japanese unexamined patent publication (KOKAI) No. 11-176987, there is disclosure of technology which provides a plurality of electrode pads on the surface of a multilayer board, impedance-adjusting capacitors being provided between a ground electrode layer inside the multilayer board and the electrode pads. In this conventional art, a laser or the like is used to selectively remove or cut an electrode pad, thereby causing a change in the surface area of the electrode pad. An alternate method is that of cutting the connection part of a desired electrode pad, thereby selecting a capacitor to be connected to the transmission line of the matching circuit. By using such a method, the capacitance that is connected to the transmission line of the matching circuit is caused to change, thereby enabling adjustment of the impedance of the matching circuit.

In recent years, there is an increasing demand for so-called multiband and multimode radio communications apparatuses, which can accommodate communication on a plurality of frequency bands and using a plurality of modes. For example, in the digital cellular system used in Europe, both the 900-MHz GSM (Global System for Mobile Communication) and the 1.8-GHz DCS (Digital Cellular System) are widely used, making it necessary to have a portable terminal capable of using both modes. In an RF circuit module used in such a multiband or multimode radio communications apparatus, it is necessary to achieve impedance matching for each frequency band and operating mode.

Given the above, as reported in the 1999 IEEE MTT-S International Microwave Symposium Digest, pp. 1397–1400 by Yamamoto et al, two sets of amplifiers and matching circuits are separately provided to accommodate both GSM and DCS, these being selectively used to achieve impedance matching.

In the prior art disclosed in the Japanese unexamined patent publication (KOKAI) No. 11-176987, both the electrode pads and transmission line of the matching circuit are formed on the surface of a multilayer board. For this reason, there is an increase in the mounting surface area of the matching circuit, making this approach unsuitable for use in compact RF circuit modules.

Additionally, in this prior art, when adjusting the impedance a laser or the like is used to remove or cut an electrode pad, or the connection part of an electrode pad is cut. For this reason, the change in the impedance of the matching circuit is irreversible, making it impossible to use this approach to achieve impedance matching in multiband or multimode applications.

The Japanese unexamined Utility Model publication (KOKAI) No. 64-16669 discloses a multilayer circuit board which provides a plurality of capacitors. In this prior art, when changing an overall capacitance of the capacitor, the wiring formed on the multilayer circuit board is changed. Therefore, it is impossible to obtain reversible impedance change in this circuit.

In technology for providing separate circuitry for each frequency band or each operating mode, although use is possible in a multiband or multimode radio communications apparatus, there is an increase in the number of components used in the RF circuit module, thereby causing the problem of difficulty in achieving a compact, low-cost RF circuit module.

Stated differently, in the conventional art, it is not possible to find and use a reactance element that not only is amenable to reversible impedance change, but also that is compact.

Accordingly, it is an object of the present invention is to provide a variable capacitor capable of reversible change in the capacitance, and additionally, capable of an reversible change in impedance, and also capable of being implemented in a compact form.

Another object of the present invention is to provide a variable inductor capable of reversible change in the inductance, and by extension, capable of an reversible change in impedance, and also capable of being implemented in a compact form.

Yet another object of the present invention is to provide an RF circuit module capable of easy adjustment for a deviation in impedance caused by variations in manufacturing, capable of accommodating multiband and multimode operation, and capable of compact, low-cost implementation.

SUMMARY OF THE INVENTION

In order to achieve the above-noted object, the present invention adopts the following basic technical constitution.

Specially, the first aspect of the present invention is a variable capacitor comprising: a multilayer circuit board having a plurality of dielectric layers; a first conductive plate, provided within the multilayer circuit board, for serving as one electrode of the variable capacitor; a second conductive plate, provided within the multilayer circuit board, for serving as the other electrode of the variable capacitor; a plurality of third conductive plates provided between the first conductive plate and the second conductive plate; and a plurality of switching means provided for grounding the third conductive plates selectively.

The second aspect of the present invention is a variable capacitor comprising: a multilayer circuit board having a plurality of dielectric layers; a first conductive plate, provided within the multilayer circuit-board, for serving as one electrode of the variable capacitor; a second conductive plate, provided within the multilayer circuit board, for serving as the other electrode of the variable capacitor; a plurality of third conductive plates provided between the first conductive plate and the second conductive plate; a plurality of terminals provided on an outer surface of the multilayer circuit.board; a plurality of via holes connecting the a plurality of third conductive plates and the a plurality of terminals, respectively; and a plurality of switching means provided for grounding said third conductive plates via said terminals selectively.

The third aspect of the present invention is a variable inductor comprising: a multilayer circuit board having a plurality of dielectric layers; a first conductive plate, provided within the multilayer circuit board, for serving as a transmission line; a second conductive plate, provided within the multilayer circuit board, for serving as a grand plate of the transmission line; a third conductive plate, provided between the first conductive plate and second conductive plate, for serving as a grand plate of the transmission line; and a plurality of switching means provided for grounding either one of the second and the third conductive plate selectively.

The fourth aspect of the present invention is a variable inductor comprising: a multilayer circuit board having a plurality of dielectric layers; a first conductive plate, provided within the multilayer circuit board, for serving as a transmission line; a second conductive plate, provided within the multilayer circuit board, for serving as a grand plate of the transmission line; a third conductive plate, provided between the first conductive plate and second conductive plate, for serving as a grand plate of the transmission line; a terminal provided on an outer surface of the multilayer circuit board; and a via hole connecting the third conductive plate and the terminal.

BRIEF DESCRIPTIONS OF THE DRAWINGS

DETAILED DESCRIPTION OF THE PREFERRED EMBODIMENTS

Embodiments of the present invention are described in detail below, with reference made to relevant accompanying drawings.

First Embodiment

[Constitution]

Figure 1:
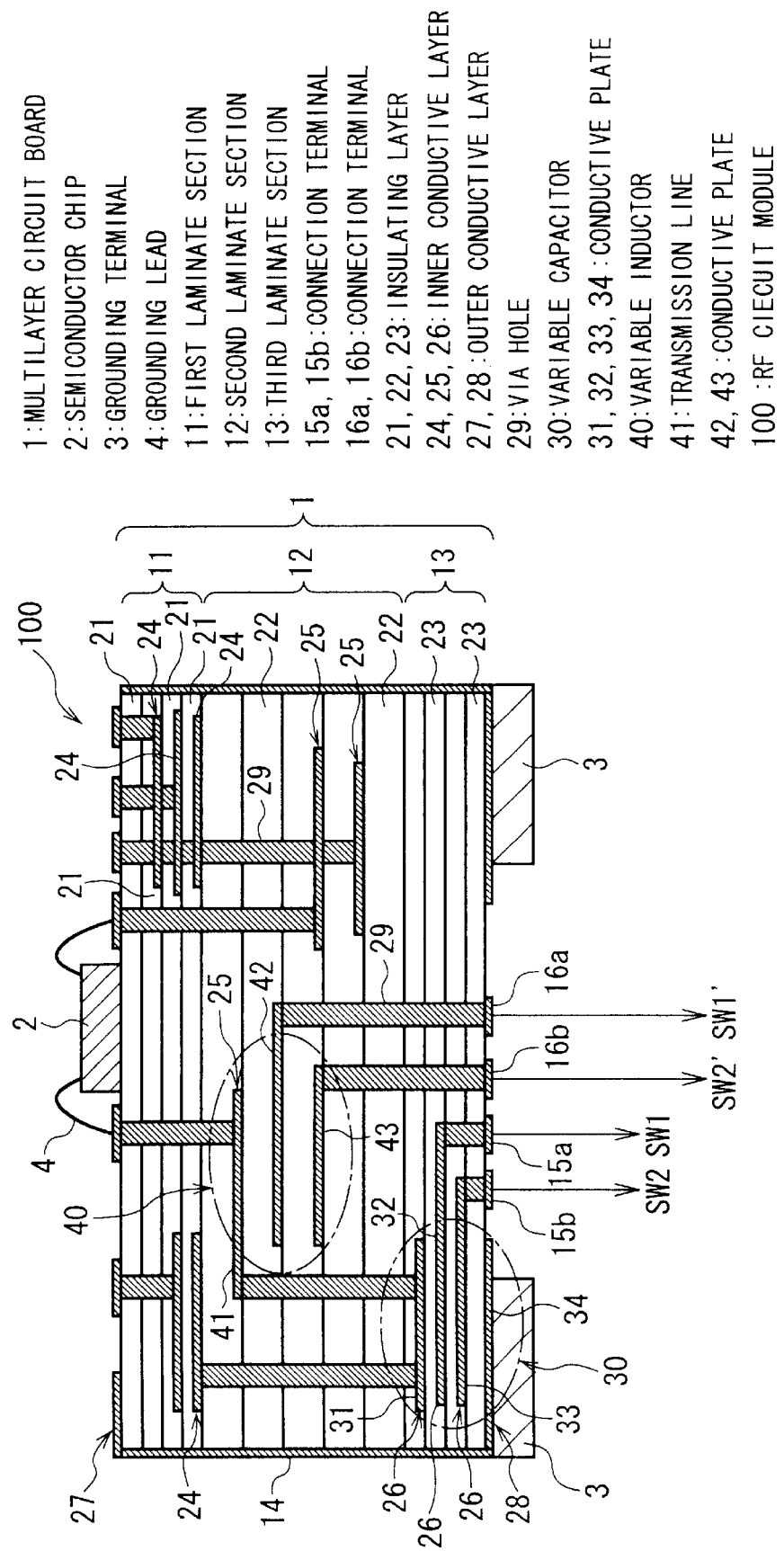
FIG. 1 is a simplified cross-sectional view showing an RF circuit module according to a first embodiment of the present invention.
Figure 2:
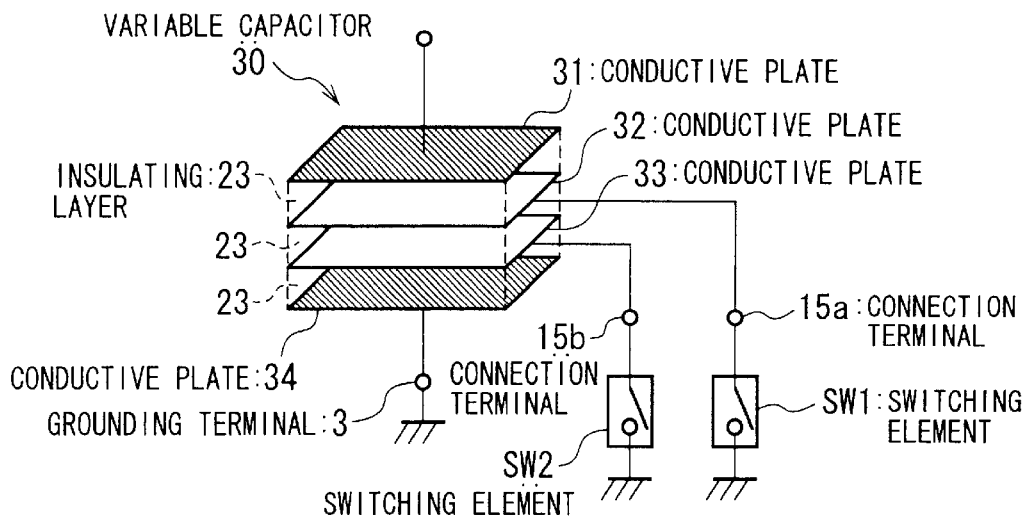
FIG. 2 is a perspective view showing a variable capacitor of the RF circuit module of FIG. 1.
Figure 3:
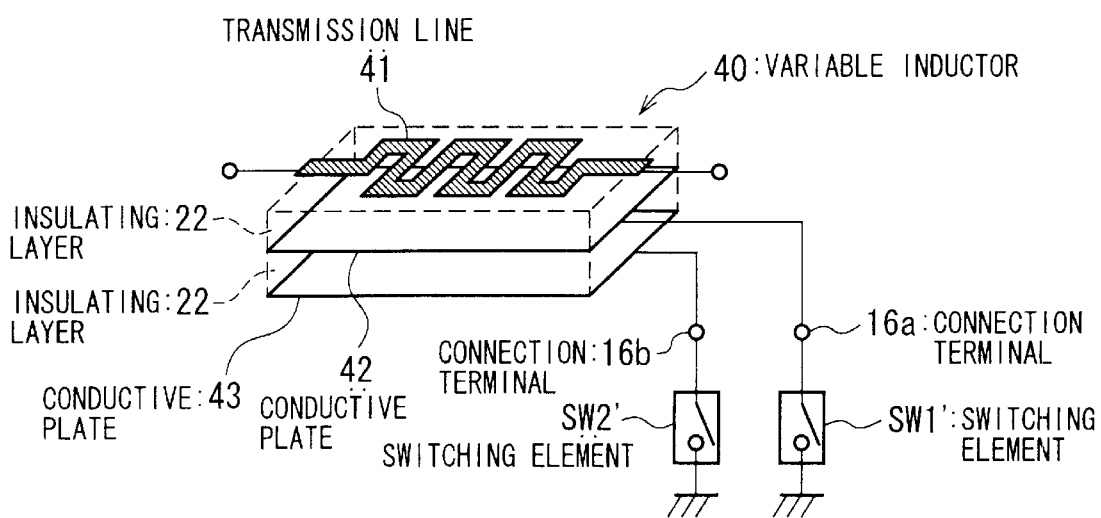
FIG. 3 is a perspective view showing a variable inductor of the RF circuit module of FIG. 1.

Specifically, FIG. 1 shows a simplified cross-sectional view of an RF circuit module 100 according to a first embodiment of the present invention, and FIG. 2 and FIG. 3 are enlarged perspective views showing a variable capacitor 30 and a variable inductor 40 of the RF circuit module 100, respectively.

As shown in FIG. 1, the RF circuit module 100 has a multilayer substrate (multilayer circuit board) 1 having therewithin the variable capacitor 30 and the variable inductor 40, and a semiconductor chip 2 mounted on the surface of the multilayer substrate 1.

The multilayer substrate 1 has a first laminate section 11, formed by the lamination of four insulating layers 21 and three inner conductive layers 24 patterned to a prescribed shape, a second laminate section 12, formed by the lamination of five insulating layers 22 and four inner conductive layers 25 patterned to a prescribed shape, and a third laminate section 13, formed by the lamination of four insulating layers 24 and three inner conductive layers 26 patterned to a prescribed shape.

Each of the insulating layers 21 of the first laminate section 11 is made from a glass ceramic layer having a dielectric constant of 7.1 and a thickness of 40 $\mu$m. Each of the insulating layers 22 of the second laminate section 12 is formed by a glass ceramic layer having a dielectric constant of 4.8 and a thickness of 160 $\mu$m. Each of the insulating layers 23 of the third laminate section 13 is formed by a glass ceramic layer having a dielectric constant of 7.1 and a thickness of 40 $\mu$m.

On the front surface of the uppermost insulating layer 21 of the first laminate section 11 is formed an outer conductive layer 27 patterned to a prescribed shape, and on the reverse surface of the lowermost insulating layer 23 of the third laminate section 13 is formed an outer conductive layer 28 patterned to a prescribed shape.

A plurality of via holes 29 are formed inside the multilayer substrate 1. Electrical connections are made via these via holes at prescribed positions between the inner conductive layers 24, 25, and 26 and the outer conductive layers 27 and 28. By doing this, an RF circuit module is formed on the multilayer substrate 1.

The inner conductive layers 26 of the third laminate section 13 form conductive plates 31, 32, and 33, respectively and the outer conductive layer 28 forms the conductive plate 34. All of these conductive plates 31, 32, 33, and 34 are squares having a side length of 2 mm.

As is clear from FIG. 2, the conductive plate 32 is in opposition to conductive plate 31 via the insulating layer 23, an the conductive plate 33 is in opposition to the conductive plate 32 via the insulating layer 23. Additionally, the conductive plate 34 is in opposition to the conductive plate 33 via the insulating layer 23. The four conductive plates 31, 32, 33, and 34 form a variable capacitor 30 of the RF circuit module. The three insulating layers 23 between the conductive plates 31, 32, 33, and 34 function as the dielectric layer of the variable capacitor 30.

The inner conductive layers 25 of the second laminate section 12 form a meander transmission line 41 and two rectangular conductive plate 42 and 43. The length of the transmission line 41 is 6 mm, and the width thereof is 200 μm.

As is clear from FIG. 3, the insulating layer 22 of the conductive plate 42 is in opposition to the transmission line 41 via the insulating layer 22, and the conductive plate 43 is in opposition to the conductive plate 42 via the insulating layer 22. For this reason, the respective distances from the transmission line 41 to the conductive plates 42 and 43 are different, respectively. The transmission line 41 and the conductive plates 42 and 43 form the variable inductor 40 of the RF circuit module.

The outer conductive layer 28 forms two connection terminals 15a and 15b for the purpose of making electrical connections from the conductive plates 32 and 33 of the variable capacitor 30 to external switch elements SW1 and SW2. Additionally, it forms two connection terminals 16a and 16b for the purpose of making electrical connections from the conductive plates 42 and 43 of the variable inductor 40 to external switch elements SW1' and SW2'.

The overall side surface of the multilayer substrate 1 is covered by a shield layer 14 made of a conductor. The reverse surface of the multilayer substrate 1 is provided with a grounding terminal 3, which makes contact with a prescribe d location on the outer conductive layer 28 so as to make electrical connection therewith.

The semiconductor chip 2 has its connection leads 4 fixed to prescribed locations on the outer conductive layer 27, thereby making electrical connections to the RF circuit module.

When mounting a RF circuit module 100 configured as described above, switch elements SW1, SW2 provided on the circuit mounting substrate (not shown in the drawing) make contact with the connection terminals 15a and 15b, thereby making electrical connection between a ground line provided on the circuit mounting substrate and the grounding terminal 3. By doing this, as shown in FIG. 2 the conductive plates 32 and 33 of the variable capacitor 30 are grounded via the switch elements SW1 and SW2, and the conductive plate 34 of the variable capacitor 30 is grounded.

Additionally, switch elements SW1' and SW2' provided on the circuit mounting substrate are electrically connected to the connection terminals 16a and 16b, thereby grounding the conductive plates 42 and 43 of the variable inductor 30 via the switch elements SW1' and SW2', as shown in FIG. 3.

In an RF circuit module 100 mounted in this manner, the closing and opening operation of the externally connected switch elements SW1 and SW2 the conductive plates 32 and 33 of the variable capacitor 30 are either grounded or left electrically floating. Additionally, the closing and opening operation of the externally connected switch elements SW1' and SW2' either ground or leave electrically floating the conductive plates 42 and 43 of the variable inductor 40.

[Operation of the Variable Capacitor]

The operation of the variable capacitor 30 is described below, with reference to FIG. 4.

Figure 4A:
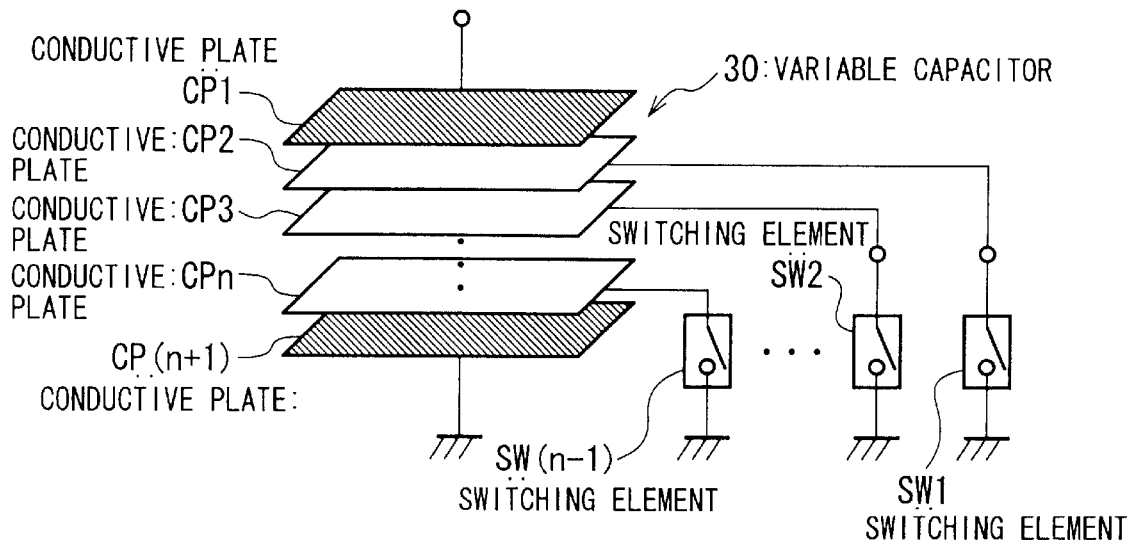
FIG. 4(a) is a perspective view illustrating the operating principle of a variable capacitor according to the first embodiment of the present invention.

As shown in FIG. 4(a), the variable capacitor 30 has (n+1) conductive plates CP1, CP2, CP3, . . . , CPn, CP(n+1), the conductive plates CP2, CP3, . . . , CPn being grounded via the switch elements SW1, SW2, . . . , SW (n−1), and the conductive plate CP(n+1) being directly grounded.

Figure 4B:
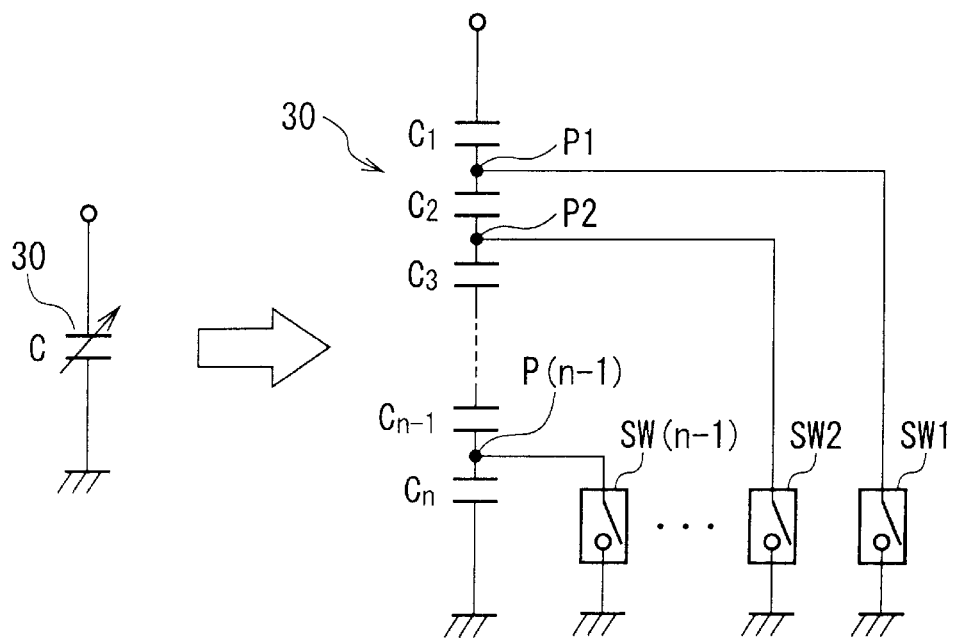
FIG. 4(b) is an equivalent circuit diagram thereof.

The variable capacitor 30 shown in FIG. 4(a) has, as shown in the equivalent circuit of FIG. 4(b), n capacitors connected in series, the interconnection nodes P1, P, . . . , P(n−1) therebetween being grounded via the switch elements SW1, SW2, . . . , SW(n−1).

In general, in the case of capacitor having two opposing conductive plates, the resulting capacitance Ci [F], with a distance of d meters between the conductive plates, a conductive plate surface area of S m², the dielectric constant of a vacuum $\epsilon_0$ of $8.85 \times 10^{-12}$ F/m, and the dielectric constant of the dielectric between the conductive plates $\epsilon_r$, is given by the following equation.

$$C_1 = \varepsilon_i \varepsilon_o \frac{S}{d} \quad [F] \tag{1}$$

In the case of the variable capacitor 30 of FIG. 4(a), if the capacitance between the mutually opposing conductive plates is Ci, the overall capacitance C is given by the following equation.

$$\frac{1}{C} = \frac{1}{C_1} + \frac{1}{C_2} + \cdots + \frac{1}{C_n} \quad [F] \tag{2}$$

In this case, of the conductive plates CP2, CP3, . . . , CPn, those not having a fixed potential, that is, those that are in an electrically floating condition, do not contribute to the overall capacitance C. For example, if only the switch element SW2 is in the "ON" condition, only the third conductive plate from the top, CP3, is grounded, so that it is as if subsequent conductive plates. CP4 through CP(n+1) did not exist, so that the overall capacitance is given by Equation (3).

$$\frac{1}{C} = \frac{1}{C_1} + \frac{1}{C_2} \quad [F] \tag{3}$$

If only switch element SW1 is placed in the on condition, with the second conductive plate from the top, CP2, grounded, the overall capacitance $C=C_1$.

In this manner, by appropriately setting the "ON" and "OFF" conditions of the switch elements SW1, SW2, . . . , SW(n−1), it is possible to cause the capacitance C of the variable capacitor 30 to change.

In the variable capacitor 30 of FIG. 2, the surface areas of the four conductive plates 31, 32, 33, and 34 are equal, and the dielectric constant $\epsilon_r$ and thickness of the three insulating layers (that is, the dielectric layers) sandwiched between the conductive plates 31, 32, 33, and 34 are equal. Therefore, this corresponds the case in which, in the above-noted Equation (2) n=3 and $C_1=C_2=C_3$ (=$C_0$=6.3 pF). As shown in Table 1 below, in accordance with the open and closed ("OFF" and "ON") conditions of the switch elements SW1 and SW2, the overall capacitance C changes between ($C_0/3$), ($C_0/2$), and $C_0$.

TABLE 1

| Switch element open/closed conditions | | Capacitance |
|---|---|---|
| SW1 | SW2 | C (pF) |
| OFF | OFF | $C_0/3$ = 2.1 |
| OFF | ON | $C_0/2$ = 3.1 |
| ON | OFF | $C_0$ = 6.3 |

Thus, in the case in which both switch elements SW1 and SW2 are in the "OFF" condition, the conductive plates 32 and 33 are in the electrically floating condition, so that the overall capacitance between the conductive plates 31 and 34 is that of three capacitances $C_0$ connected in series, which is $C_0/3$.

With the switch element SW1 in the "OFF" condition and the switch element SW2 in the "ON" condition, the conductive plate 32 is in the electrically floating condition, so that the conductive plates 31 and 33 operate as an electrode pair that generates the capacitance C. For this reason, the overall capacitance generated is that of two capacitances $C_0$ connected in series, which is $C_0/2$.

In the case in which both switch elements SW1 and SW2 are in the "ON" condition, the conductive plate 31 and 32 operate as an electrode pair that generates the capacitance C. For this reason, the overall capacitance is that of a signal capacitance $C_0$.

In this manner, any two of the conductive plates 31, 32, 33, and 34 operate as an electrode pair that forms the capacitance C, this capacitance being selected by the open and closed conditions of the switch elements SW1 and SW2, which establish the combination of conductive plates 31, 32, 33, and 34 to operate as the electrode pair, thereby changing the overall capacitance C. Furthermore, because the open and closed conditions of the switch elements SW1 and SW2 can be freely changed any number of times, it is possible to reversibly change the capacitance C.

[Operation of the Variable Inductor]

The operating principle of the variable inductor 40 is described below, with reference made to FIG. 5.

Figure 5A:
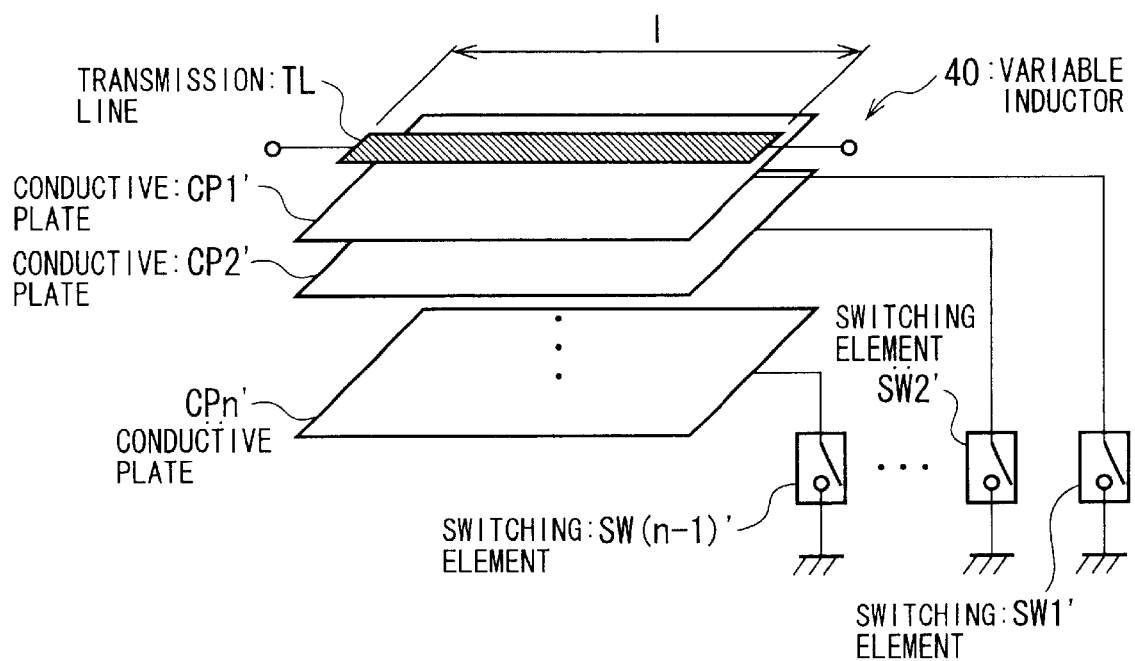
FIG. 5(a) is a perspective view illustrating the operating principle of a variable inductor according to the first embodiment of the present invention.

In this case, as shown in FIG. 5(a), the variable inductor 40 has a transmission line TL with a line length of 1, and n conductive plates CP1', CP2', . . . , CPn', the conductive, plates CP1', CP2', . . . , CPn' being grounded through switch elements SW1', SW2', . . . , SWn.

In general, if the characteristic impedance of a transmission line TL is $Z_0$, for the case in which the length 1 of the transmission line TL is sufficiently shorter than the wavelength $\lambda_g$, where $\lambda_g$ is wavelength including the velocity factor, the transmission line can be treated as an inductor having an inductance that is equivalently approximated by Equation (4).

$$L = \frac{Z_0 \cdot l}{\lambda_g \cdot f} \quad (4)$$

In this relationship, f is the frequency of a signal supplied to the transmission line TL.

The characteristic impedance $Z_0$ in Equation (4) varies in accordance with the distance to the ground plane opposite the transmission line TL, with the characteristic impedance $Z_0$ becoming larger as this distance increases.

Figure 5B:
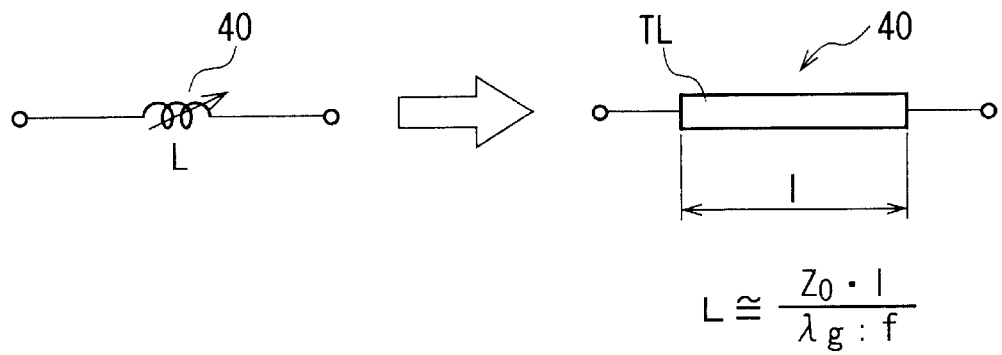
FIG. 5(b) is an equivalent circuit diagram thereof.

In the case of the variable inductor 40 shown in FIG. 5(a), by appropriately setting the open and closed conditions of the switch elements SW1', SW2', . . . , SWn', it is possible to cause any one of the conductive plates CP1', CP2', CPn' to operate as a ground plane. The distance from the transmission line TL to the ground plane is therefore changed, enabling an accompanying change in the inductance L of the variable inductor 40. That is, as shown in FIG. 5(b), a the variable inductor 40 is obtained by varying characteristic impedance $Z_0$ of the transmission line TL.

In the case of the variable inductor 40 of FIG. 3, with 1=6 mm, as shown in Table 2 below, the combinations of open and closed ("OFF" and "ON") conditions of the switch elements SW1' and SW2' result in the characteristic impedance $Z_0$ changing between 109, 79, and 57 Ω. Accompanying this, there is a change in the equivalent inductance L between the inductances 4.8, 3.5, and 2.5 nH.

TABLE 2

| Switch element open/closed conditions | | Characteristic impedance $Z_0$ | Inductance |
|---|---|---|---|
| SW1' | SW2' | (ohms) | L (nH) |
| OFF | OFF | 109 | 4.8 |
| OFF | ON | 79 | 3.5 |
| ON | OFF | 57 | 2.5 |

In this manner, the conductive plates 42 and 43 can operate as ground planes of the transmission line 41, and the changing of the distance from the transmission line 41 to the ground plane in accordance to the open and closed conditions of the switch elements SW1' and SW2' causes the generated inductance L to change. Furthermore, because it is possible to change freely change the open and closed conditions of the switch elements SW1' and SW2' any number of times, it is possible to reversibly change the inductance L.

[Operation of the RF Circuit Module]

The operation of the RF circuit module 100 is described below, with reference being made to FIG. 6.

Figure 6:
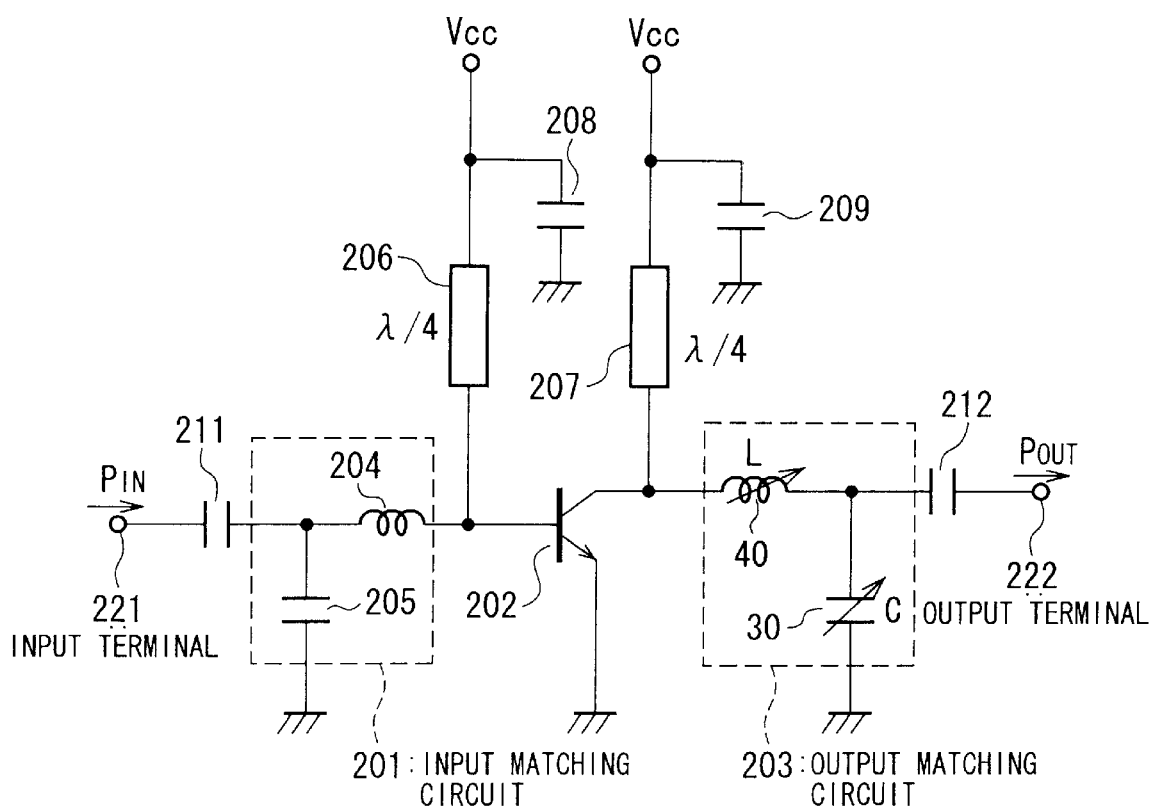
FIG. 6 is a circuit diagram showing the equivalent circuit of the RF circuit module of FIG. 1.

The RF circuit module of FIG. 6 has an input matching circuit 201 formed by a capacitor 205 and an inductor 204, a transistor 202 serving as an amplifier which corresponds to the semiconductor chip 2 in FIG. 1, and an output matching circuit 203 formed by the variable capacitor 30 and the variable inductor 40.

In this RF circuit module by adjusting the capacitance C of the variable capacitor 30 and the inductance L of the variable inductor 40, the impedance of the output matching circuit 203 is caused to change. By doing this, deviation in the impedance due to variations in manufacturing is adjusted, and it is further possible to adjust the impedance to accommodate multiband or multimode operation. In this condition, the output P supplied to the input terminal 221 is amplified by the transistor 202 and the output $P_{OUT}$ is extracted from the output terminal 222.

In FIG. 6, the reference numerals 211 and 212 denote DC blocking capacitors, 206 and 207 are λ/4 lines for applying a bias voltage, and 208 and 209 are AC blocking capacitors.

Figure 7:
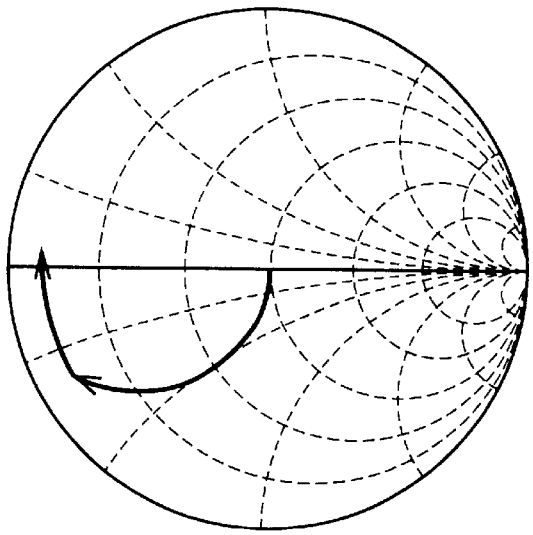
FIG. 7 is a Smith chart showing the impedance characteristics of an output matching circuit of the RF circuit module of FIG. 1.
Figure 8:
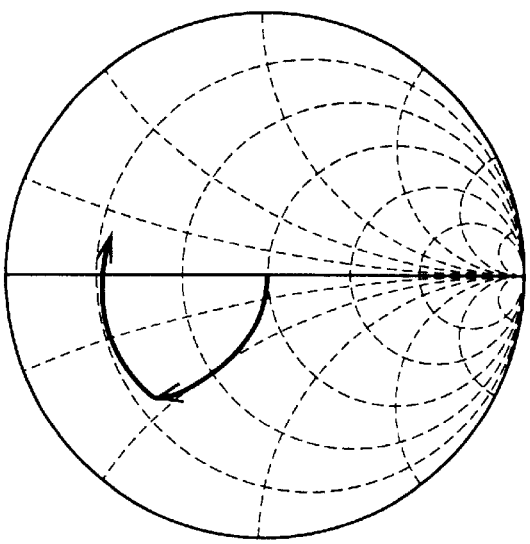
FIG. 8 is a Smith chart showing other impedance characteristics of an output matching circuit of the RF circuit module of FIG. 1.

FIG. 7 and FIG. 8 are Smith charts showing the impedance characteristics of the output matching circuit 203 of the RF circuit module 100.

By setting the switch elements SW1, SW2, SW1', and SW2' to the "ON", "OFF", "ON", "OFF" conditions respectively, the output impedance varies as shown by the arrows in FIG. 7, the output impedance being (3.3+j1.5) Ω.

In this case, the impedance obtained is the ideal impedance for extracting the maximum output power $P_{OUT}$ at the output terminal 222.

If however the switch elements SW1, SW2, SW1', and SW2' to the "OFF", "ON", "OFF", "ON" conditions respectively, the output impedance varies as shown by the arrows in FIG. 8, the output impedance being $(11+j5.7)\ \Omega$. In this case, the impedance obtained is the ideal impedance for achieving the maximum power added efficiency.

As described above, in an RF circuit module 100 according to the first embodiment of the present invention, the variable capacitor 30 and the variable inductor 40 are formed within the multilayer substrate 1. The variable capacitor 30 is made up by conductive plates 31, 32, and 33, formed by the inner conductive layer 26 of the multilayer substrate 1, the conductive plate 34, formed by the outer conductive layer 28 of the multilayer substrate 1, and the insulating layers 23 between the conductive plates 31, 32, 33, and 34. The variable inductor 40 is made up of the transmission lines 41, formed by the inner conductive layer 25 of the multilayer substrate, 1, and the conductive plates 42 and 43. These conductive plates 42 and 43 have different distances from the transmission line 41.

In mounting the RF circuit module 100, the conductive plates 32 and 33 of the variable capacitor 30 are grounded via the switch elements SW1 and SW2 provided on the circuit mounting substrate, and the conductive plate 34 of the variable capacitor 30 is grounded directly. Additionally, the conductive plates 42 and 43 of the variable inductor 40 are grounded via the switch elements SW2' and SW1' provided on the circuit mounting substrate.

For this reason, the combination of conductive plates 31, 32, 33, and 34 operating as the electrode pair generating a capacitance changes in accordance with the open and closed conditions of the switch elements SW1 and SW2, thereby causing a change in the capacitance C of the variable capacitor 30, so that it is possible to achieve a capacitor, the capacitance of which can be reversibly changed.

The characteristic impedance $Z_0$ of the transmission line 41 changes in accordance with the open and closed conditions of the switch elements SW1' and SW2', this being accompanied by a change in the equivalent inductance L of the transmission line 41. It is thereby possible to achieve a variable inductor, the inductance of which can be reversibly changed.

In the RF circuit module 100, therefore, it is possible to reversibly change the impedance of the RF circuit. It is therefore easy to adjust for deviation in impedance due to variations in manufacturing, and also to accommodate multiband and multimode operation. Furthermore, this RF circuit module 100 eliminates the need to provide separate circuits for each frequency band or for each operating mode in order to accommodate multiband or multimode operation, thereby enabling the achievement of compactness and low cost.

Additionally, with the variable capacitor 30, by appropriately setting the spacing between the conductive plates 31, 32, 33, and 34 and the dielectric constant of the inner insulating layers 23, it is possible to achieve the desired capacitance, while preventing an undue increase in the size of the conductive plates 31, 32, 33, and 34, thereby enabling the achievement.of compactness.

With the variable inductor 40, by appropriately setting the distances from the transmission line 41 to the conductive plates 42 and 43 and the shape of the transmission line 41, it is possible to achieve the desired inductance, while preventing an undue increase in the size of the transmission line 41 or the conductive plates 42 and 43, thereby enabling the achievement of compactness.

With the RF circuit module 100, therefore, it is possible to implement a module greater compactness.

Second Embodiment

Figure 9A:
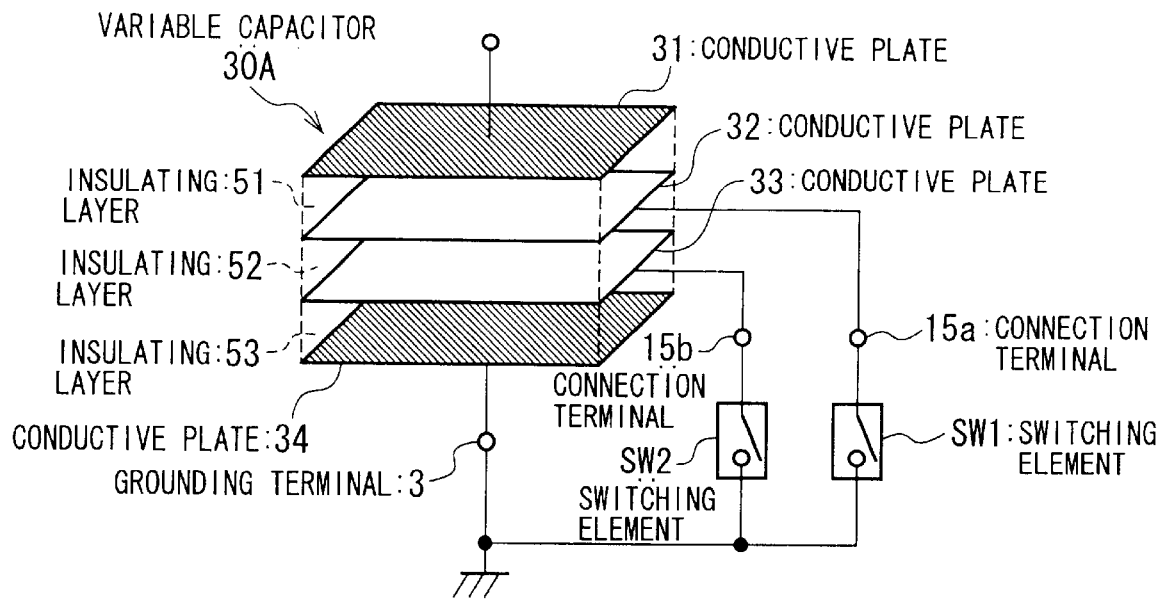
FIG. 9(a) is a perspective view showing a variable capacitor according to a second embodiment of the present invention.
Figure 9B:
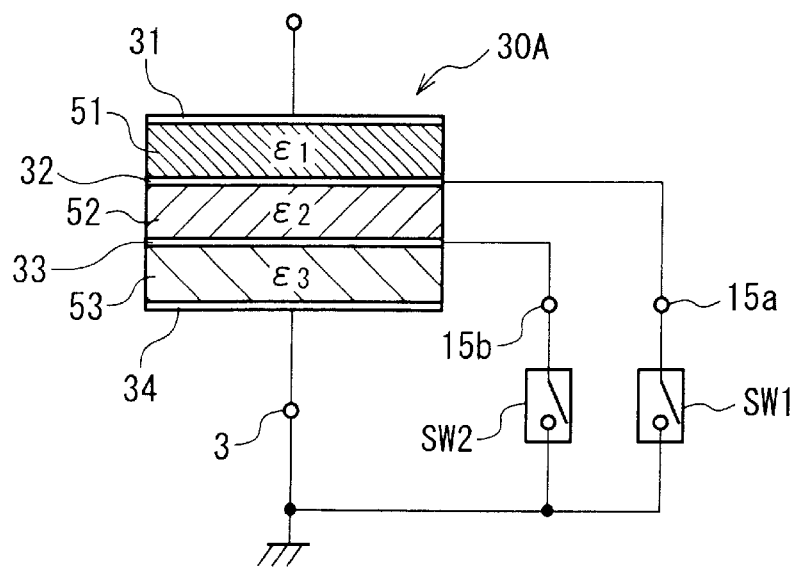
FIG. 9(b) is a vertical cross-sectional view thereof.

A variable capacitor 30A according to a second embodiment of the present invention is shown, in FIG. 9, in which FIG. 9(a) is a simplified perspective view, and FIG. 9(b) is a corresponding vertical cross-sectional view.

The capacitance value 30A of FIG. 9 differs from the variable capacitor 30 of the first embodiment in that it has three insulating layers (that is, dielectric layers) 51, 52, and 53, of differing dielectric constants. Because other features of the configuration of the capacitance 30A are the same as the variable capacitor 30 of the first embodiment, in FIG. 9 elements equivalent or.corresponding to elements of the variable capacitor 30 of the first embodiment are assigned the same reference numeral and are not explicitly described herein.

With the variable capacitor 30A, a 40-$\mu$m-thick insulating layer 51 of a high dielectric constant material having a dielectric constant of 10.5 is formed between the conductive plates 31 and 32. Additionally, a 40-$\mu$m-thick insulating layer 52 of a material having a dielectric constant of 7.1 is formed between the conductive plates 32 and 33. Further, a 40-$\mu$m-thick insulating layer 53 of a material having a dielectric constant of 4.8 is formed between the conductive plates 33 and 34.

The four conductive plates 31, 32, 33, and 34, similar to the case of the variable capacitor 30 of the first embodiment, are squares having side length of 2 mm.

With the variable capacitor 30A, as shown in Table 3 below, it is possible in accordance with the open and closed ("OFF" and "ON") conditions of the switch elements SW1 and SW2, to cause a change in the capacitance C.

TABLE 3

| Switch element open/closed conditions | | Capacitance |
| --- | --- | --- |
| SW1 | SW2 | C (pF) |
| OFF | OFF | 2.0 |
| OFF | ON | 3.7 |
| ON | OFF | 9.3 |

In this manner, in the variable capacitor 30A of the second embodiment, by using the insulating layers 51, 52, and 53, which have differing dielectric constants, compared with the variable capacitor 30 of the first embodiment, there is an added parameter imparted in the setting of the capacitance, thereby increasing the degree of freedom in design.

Third Embodiment

Figure 10A:
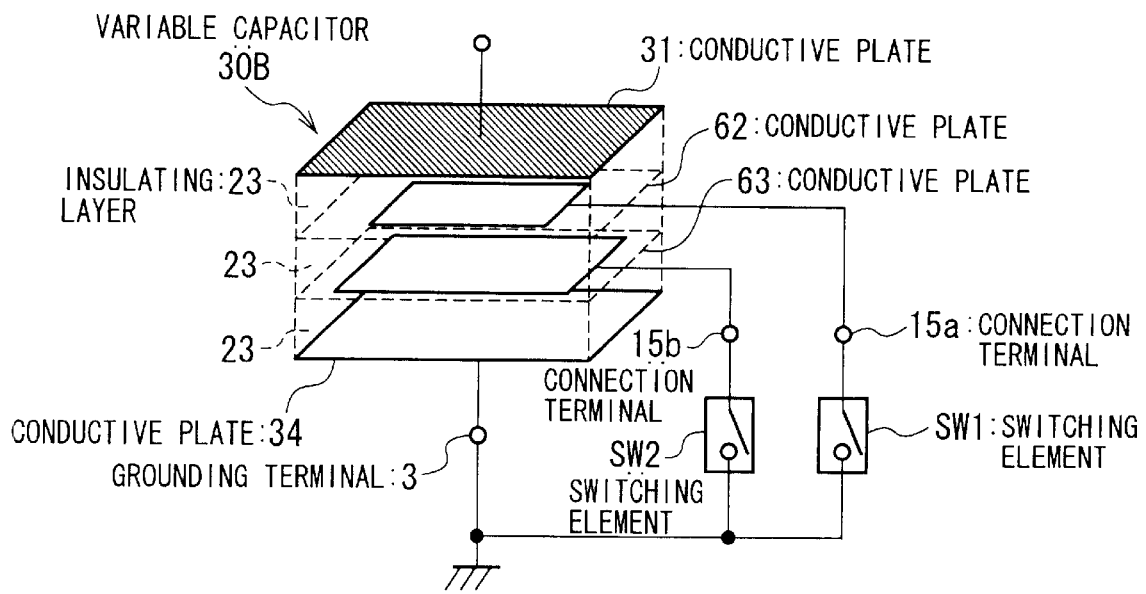
FIG. 10(a) is a perspective view showing a variable capacitor according to a third embodiment of the present invention.
Figure 10B:
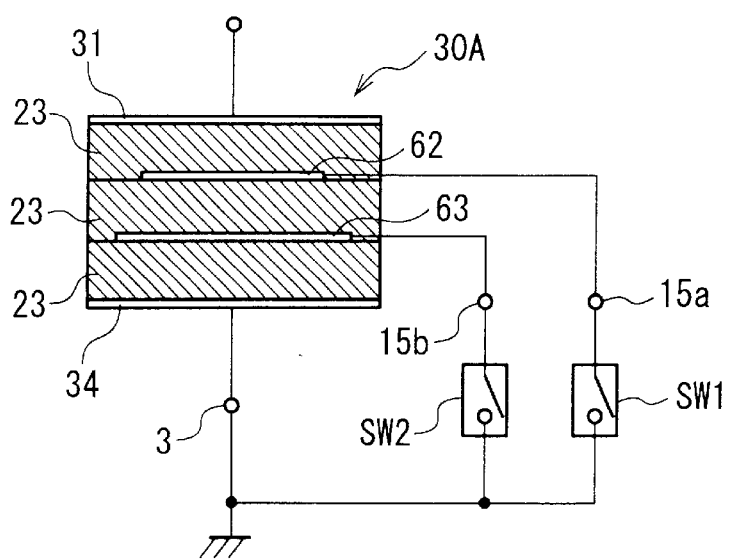
FIG. 10(b) is a vertical cross-sectional view thereof.

FIG. 10 shows a variable capacitor 30B according to a third embodiment of the present invention, in which FIG. 10(a) is a simplified perspective view, and FIG. 10(b) is a corresponding vertical cross-sectional view.

The variable capacitor 30B shown in FIG. 10 differs from the variable capacitor 30 of the first embodiment in that it has conductive plates 62 and 63 having differing surface areas opposing the conductive plates 31 and 34. Because other features of the configuration of the variable capacitor 30B are the same as the variable capacitor 30 of the first embodiment, in FIG. 10 elements equivalent or corresponding to elements of the variable capacitor 30 of the first embodiment are assigned the same reference numeral and are not explicitly described herein.

In the variable capacitor 30B, a square conductive plate 62 measuring 1 mm on a side is in opposition to the conductive plate 31, with an insulating layer (that is, dielectric layer) 23 intervening therebetween. Additionally, a square conductive plate 63 measuring 1.5 mm on a side is in opposition to the conductive plate 34, with an insulating layer (that is, dielectric layer) 23 intervening therebetween. The conductive plates 31 and 34, similar to the case of the variable capacitor 30 of the first embodiment, are squares measuring 2 mm on a side. Stated in different terms, the surface area of the conductive plate 62 is smaller than the surface areas of the conductive plates 31, 34, and. 63, and the surface area of the conductive plate 63 is smaller than the,surface areas of the conductive plates 31 and 34.

In this manner, in the case in which there is opposition between conductive plates 31 and 62, conductive plates 62 and 63, and conductive plates 63 and 34, which have differing surface areas, the capacitance generated is given by the smaller of the surface areas. For example, in the case in which the switch element SW1 is in the "ON" condition, the conductive plates 31 and 62 generate a capacitance of 1.6 pF, and the parts of conductive plates 31 and 34 not superposed with the conductive plate 62 generate a capacitance of 1.6 pF. The overall variable capacitor 30B generates a capacitance of 3.2 pF, given by the parallel connection of these two 1.6 pF capacitances.

With the variable capacitor 30B, as shown in Table 4 below, it is possible in accordance with the closed and open ("ON" and "OFF") conditions of the switch elements SW1 and SW2 to cause a change in the capacitance C.

TABLE 4

| Switch element open/closed conditions | | Capacitance |
| --- | --- | --- |
| SW1 | SW2 | C (pF) |
| OFF | OFF | 2.1 |
| OFF | ON | 2.7 |
| ON | OFF | 3.2 |

As shown in Table 4, with the variable capacitor 30B 10 of the third embodiment, it is possible to make fine changes in the capacitance C in the range from 2.1 to 3.2 pF. Thus, compared with the variable capacitor 30 of the first embodiment there is an additional parameter for setting the capacitance value, and an increased degree of freedom in design.

Fourth Embodiment

Figure 11A:
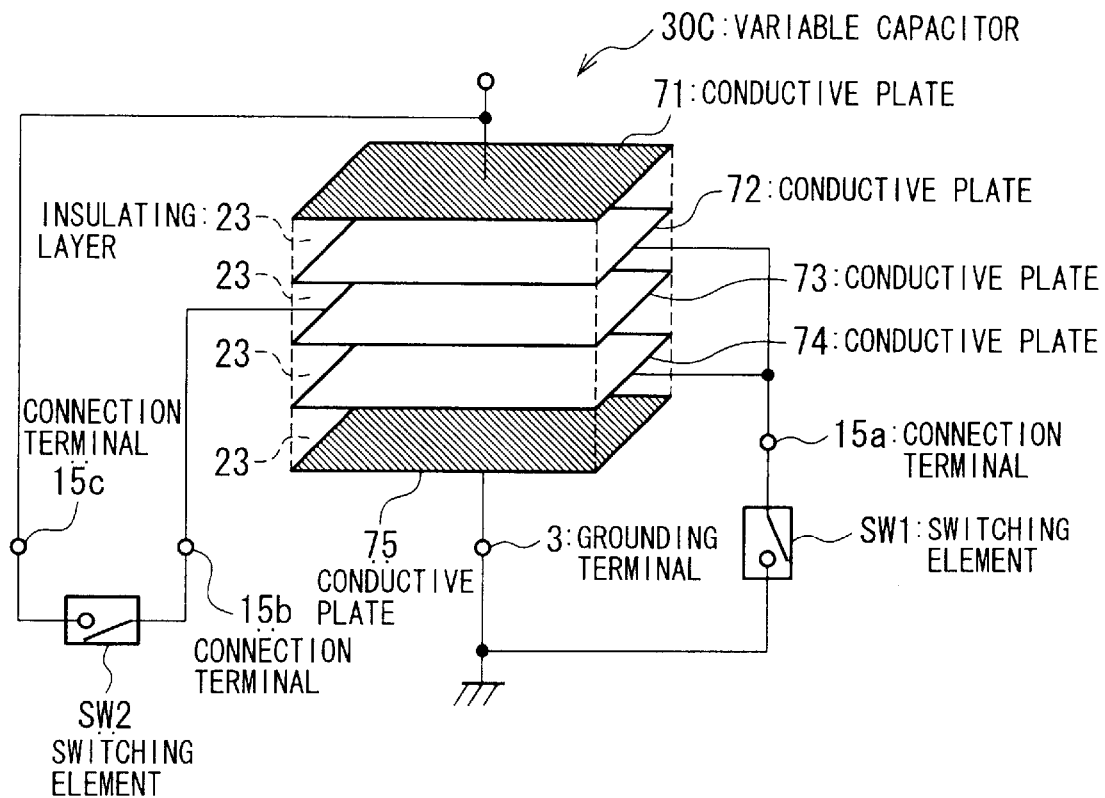
FIG. 11(a) is a perspective view showing a variable capacitor according to a fourth embodiment of the present invention.
Figure 11B:
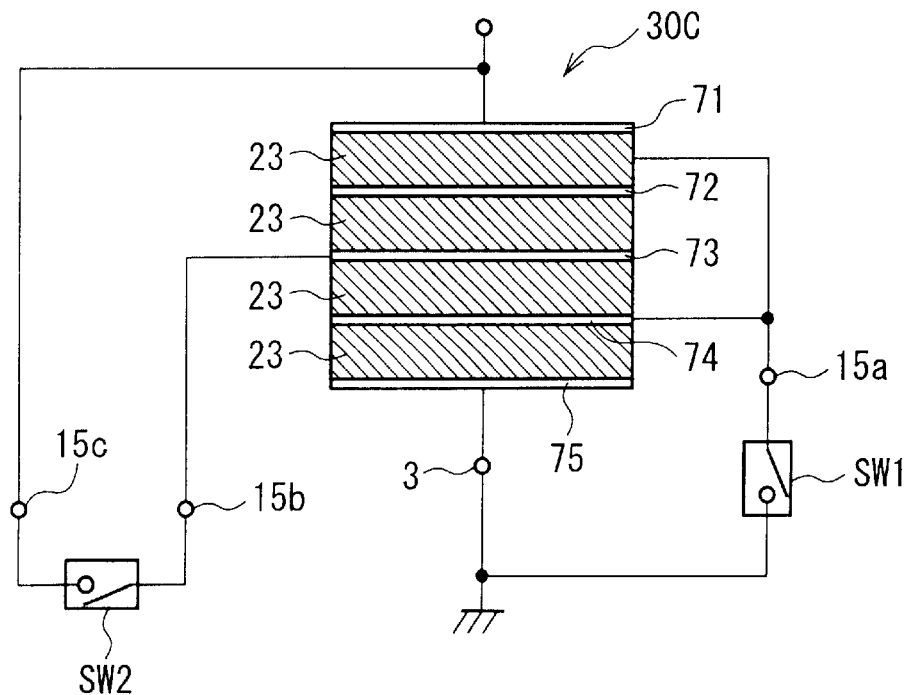
FIG. 11(b) is a vertical cross-sectional view thereof.

FIG. 11 shows a variable capacitor 30C according to a fourth embodiment of the present invention, in which FIG. 11(a) is a simplified perspective view, and FIG. 11(b) is a corresponding vertical cross-sectional view.

The variable capacitor 30C of FIG. 11 has conductive plates 71, 72, 73, and 74 laminated with 40-$\mu$m-thick insulating layers (that is, dielectric layers) having a dielectric constant of 7.1 therebetween. The conductive plates 71, 72, 73, and 74 are squares measuring 2 mm on a side.

With the RF circuit module 100 having therewithin the variable capacitor 30C, the conductive plates 72 and 74 are mutually electrically connected through a via hole 29 provided in the multilayer substrate 1, and are further electrically connected to the connection terminal 15a. The conductive plate 73 is electrically connected to the connection terminal 15b through a via hole 29 provided in the multilayer substrate 1. The conductive plate 71 is electrically connected to the connection terminal 15c through a via hole. The conductive plate 75 is electrically connected to the grounding terminal 3.

When mounting an RF circuit module 100 having therewithin a variable capacitor 30C, a switch element SW1 provided on a circuit mounting substrate (not shown in the drawing) makes electrical connection with the connection terminal 15a. One end of the switch element SW2 makes electrical connection with the connection terminal 15b, and the other end thereof makes electrical connection with the connection terminal 15c. A ground line provided on the circuit mounting substrate makes electrical connection with the grounding terminal 3. By these electrical connections, as shown in FIG. 11, the conductive plates 72 and 74 are grounded via the switch element SW1, and the conductive plate 75 is grounded directly. Additionally, the conductive plate 73 is electrically connected to the conductive plate 71 via the switch element SW2.

With the variable capacitor 30C, the capacitance C changes in accordance with the open and closed ("OFF" and "ON") conditions of the switch elements SW1 and SW2, as shown in Table 5.

TABLE 5

| Switch element open/closed conditions | | Capacitance |
| --- | --- | --- |
| SW1 | SW2 | C (pF) |
| OFF | OFF | 1.6 |
| OFF | ON | 3.1 |
| ON | OFF | 6.3 |
| ON | ON | 19 |

With the variable capacitor 30C, in the case in which the switch elements SW1 and SW2 are both "OFF", the conductive plates 71, and 75 operate as an electrode pair that generates the capacitance C, the resulting value of C being the minimum possible value of 1.6 pF.

In the case in which the switch elements SW1 and SW2 are both "ON", the conductive plates 71 and 73 operate as one electrode of the electrode pair that generates the capacitance C, while the conductive plates 72 and 74 operate as the other electrode. The capacitance of 6.3 pF is generated by the conductive plates 71 and 72, the conductive plates 72 and 73, and the conductive plates 73 and 74. The overall variable capacitor 30C generates a capacitance of 19 pF, which is given by the parallel connection of these three capacitances, this being the maximum possible value of C.

In this manner, with the variable capacitor 30C of the fourth embodiment, because the configuration enables a plurality of conductive plates to operate as one electrode of the electrode pair, it is possible to change the capacitance C in the range from 1.6 to 19 pF. Therefore, in comparison with the variable capacitor 30 of the first embodiment, the variable capacitor 30C has an added parameter for setting the capacitance, thereby providing an improved degree of design freedom.

Fifth Embodiment

Figure 12A:
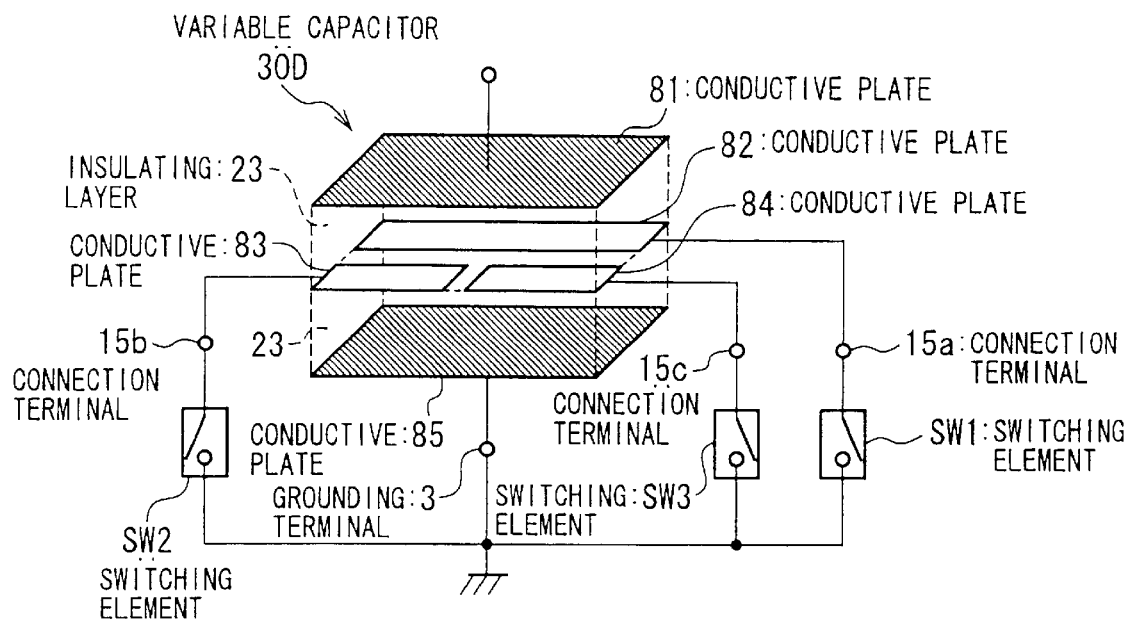
FIG. 12(a) is a perspective view showing a variable capacitor according to a fifth embodiment of the present invention.
Figure 12B:
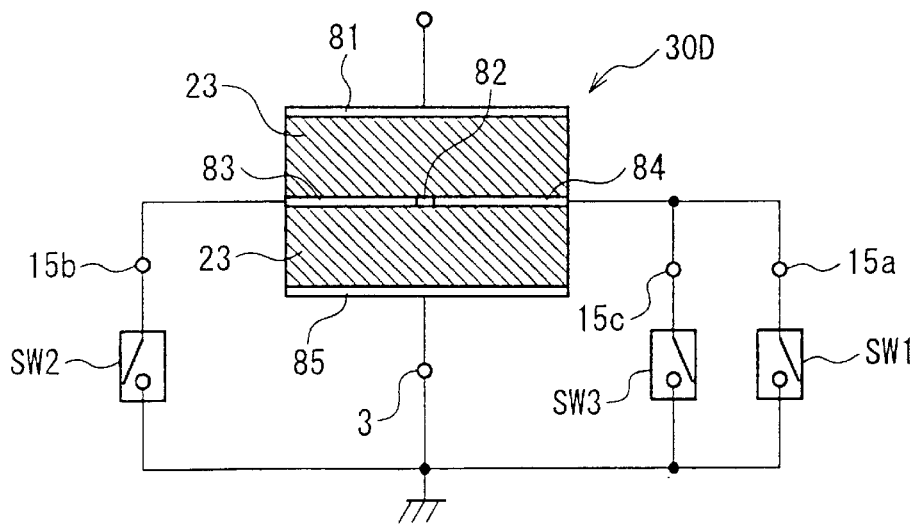
FIG. 12(b) is a vertical cross-sectional view thereof.

FIG. 12 shows a variable capacitor 30D according to a fifth embodiment of the present invention, in which FIG. 12(a) is a simplified perspective view, and FIG. 12(b) is a corresponding vertical cross-sectional view.

The variable, capacitor 30D of FIG. 12 has three conductive plates 82, 83, and 84, in opposition to the conductive plate 81, with insulating layers (that is dielectric layers) 23 therebetween, and a conductive plate 85 in opposition to the conductive plates 82, 83, and 84, with an insulating layer (that is dielectric layer) 23 therebetween. The conductive plates 82, 83, and 84 are mutually separated within one and the same plane.

The conductive plates 81 and 85 are squares measuring 2.5 mm on a side. The conductive plate 82 is a rectangle measuring 2.5 mm by 1 mm. The conductive plates 83 and 84 are squares measuring 1 mm on a side. The spacing between the conductive plates 82 and 83, the conductive plates 82 and 84, and the conductive plates 83 and 84 is each 0.5 mm.

The insulating layer 23, similar to the case of the variable capacitor 30 of the first embodiment, has a thickness of 40 $\mu$m and a dielectric constant of 7.1.

In a RF circuit module 100 having therewithin a variable capacitor 30D, the conductive plates 82, 83, and 84 are electrically connected to the connection terminals 15a, 15b, and 15c through corresponding via holes 29 in the multilayer substrate 1. The conductive plate 85 is electrically connected to the grounding terminal 3.

In mounting the RF circuit module 100 having therewithin the variable capacitor 30D, switch elements SW1, SW2, and SW3 provided on a circuit mounting substrate (not shown in the drawing) make electrical connections to the connection terminals 15a, 15b, and 15c, respectively. A ground line provided on the multilayer substrate is electrically connected to the grounding terminal 3. By these connections, as shown in FIG. 12, the conductive plates 82, 83, and 84 are grounded via the switch elements SW1, SW2, and SW3, and the conductive plate 85 is grounded directly.

In this manner, in the case in which there is opposition between conductive plates 81 and 82, conductive plates 81 and 83, conductive plates 81 and 84, conductive plates 82 and 85, conductive plates 83 and 85, and conductive plates 84 and 85, which have differing surface areas, the capacitance generated is given by the smaller of the surface areas. For example, in the case in which the switch element SW1 only is in the "ON" condition, the conductive plates 81 and 82 generate a capacitance of 3.9 pF, and the parts of conductive plates 81 and 85 not superposed with the conductive plate 82 generate a capacitance of 2.9 pF. The overall variable capacitor 30D generates a capacitance of 6.9 pF, given by the parallel connection of these two capacitances.

With the variable capacitor 30D, as shown in Table 6 below, the capacitance C changes in accordance with the open ("OFF") and closed ("ON") conditions of the switch elements SW1, SW2, and SW3.

TABLE 6

| Switch element open/closed conditions | | | Capacitance |
| --- | --- | --- | --- |
| SW1 | SW2 | SW3 | C (pF) |
| OFF | OFF | OFF | 4.9 |
| ON | OFF | OFF | 6.9 |
| OFF | ON | OFF | 5.7 |
| ON | ON | OFF | 7.7 |
| ON | ON | ON | 8.4 |

As shown in Table 6, with the variable capacitor 30D of the fifth embodiment, it is possible to finely change the capacitance C within the range from 4.9 to 8.4 pF. Therefore, compared with the variable capacitor 30 of the first embodiment, an additional parameter is provided when setting the capacitance value, thereby improving the degree of design freedom.

Sixth Embodiment

Figure 13:
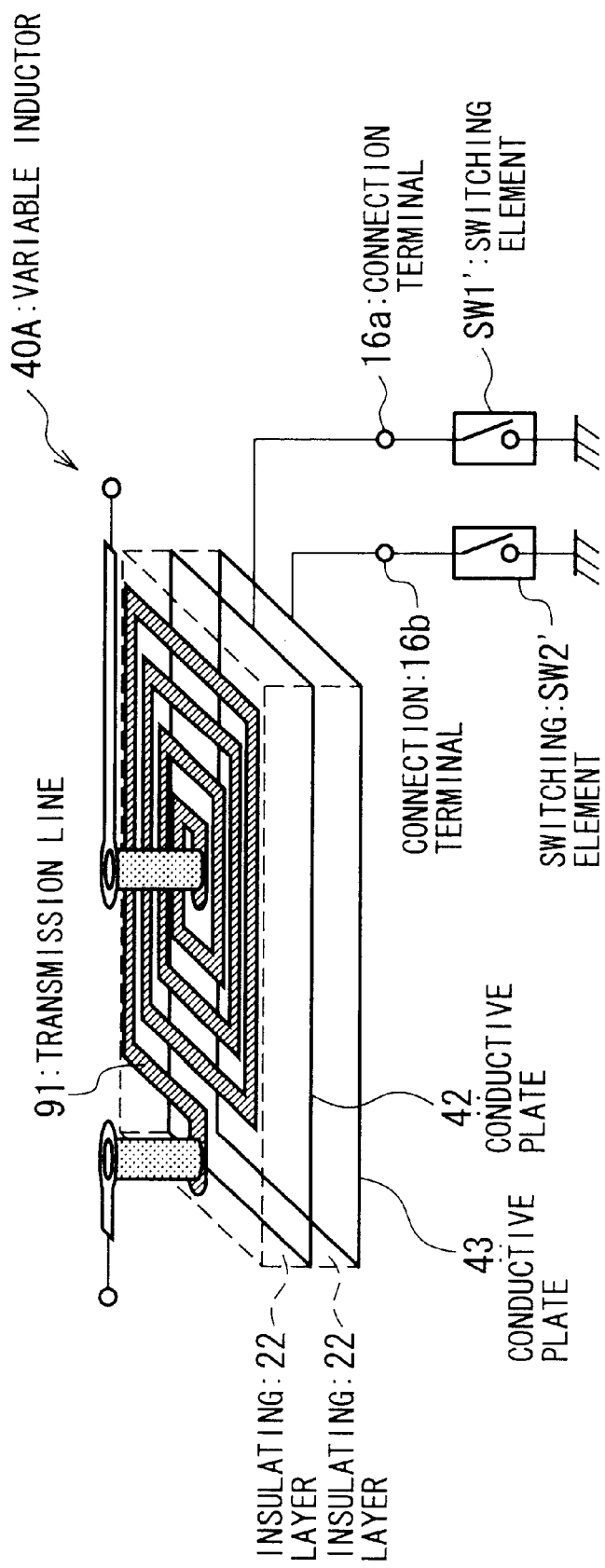
FIG. 13 is a perspective view showing a variable inductor according to a sixth embodiment of the present invention.

FIG. 13 is a simplified perspective view of a variable inductor 40A according to a sixth embodiment of the present invention.

The variable inductor 40A differs from the variable inductor 40 of the first embodiment in that it has a spiral-shaped transmission line (that is, a spiral inductor) 91. Because other features of the configuration of the variable inductor 40A are the same as the variable inductor 40 of the first embodiment, in FIG. 13 elements equivalent or corresponding to elements of the variable inductor 40 of the first embodiment are assigned the same reference numeral and are not explicitly described herein.

In the variable inductor 40A of the sixth embodiment, similar to the case of the variable inductor 40 of the first embodiment, the effective inductance value L is changed.

Application Example

Figure 14:
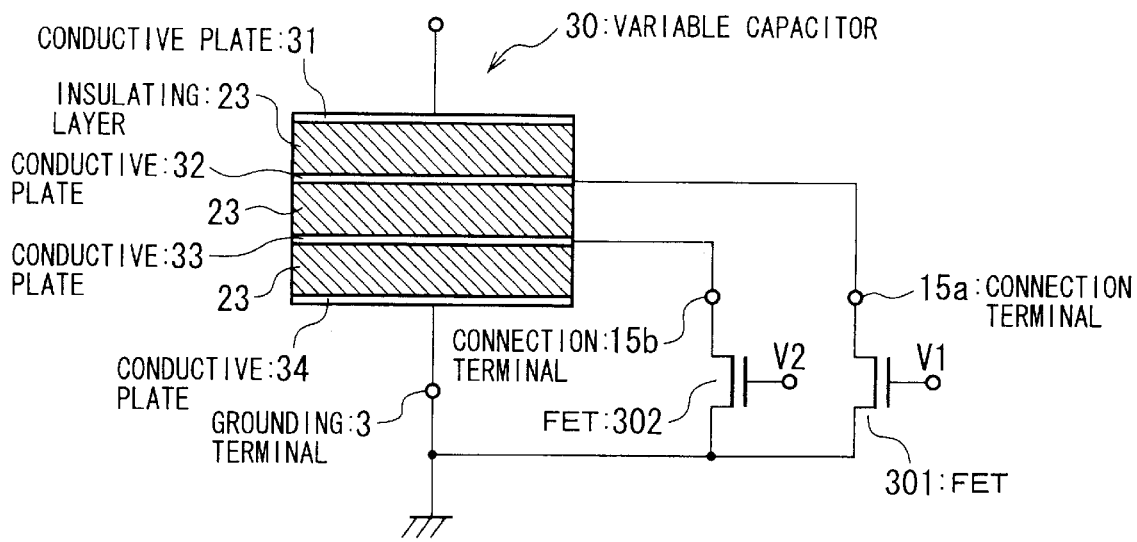
FIG. 14 is a cross-sectional view showing an application example of the variable capacitor of FIG. 2.

FIG. 14 shows an application example, in which field-effect transistors (FETs) are used as the switch elements SW1 and SW2 connected to the variable capacitor 30 of the first embodiment.

As shown in FIG. 14, in this example the drain of the FET 301 is electrically connected to the conductive plate 32, and the source thereof is grounded. The drain of the FET 302 is electrically connected to the conductive plate 33, and the source thereof is grounded. The control voltages V1 and V2 are supplied to the gates of the FETs 301 and 302.

When the control voltages V1 and V2 are made higher than the threshold voltages of the FETs 301 and 302, the FETs 301 and 302 go into the conducting condition, and the conductive plates 32 and 33 are grounded. If the control voltages V1 and V2 are made lower than the threshold voltages of the FETs 301 and 302, however, the FETs 301 and 302 go into the non-conducting condition, so that the conductive plates 32 and 33 are placed in the electrically floating condition.

In this manner, by adjusting the control voltages V1 and V2, it is possible to control the conducting condition of the FETs 301 and 302, thereby permitting the capacitance C to be changed.

Figure 15:
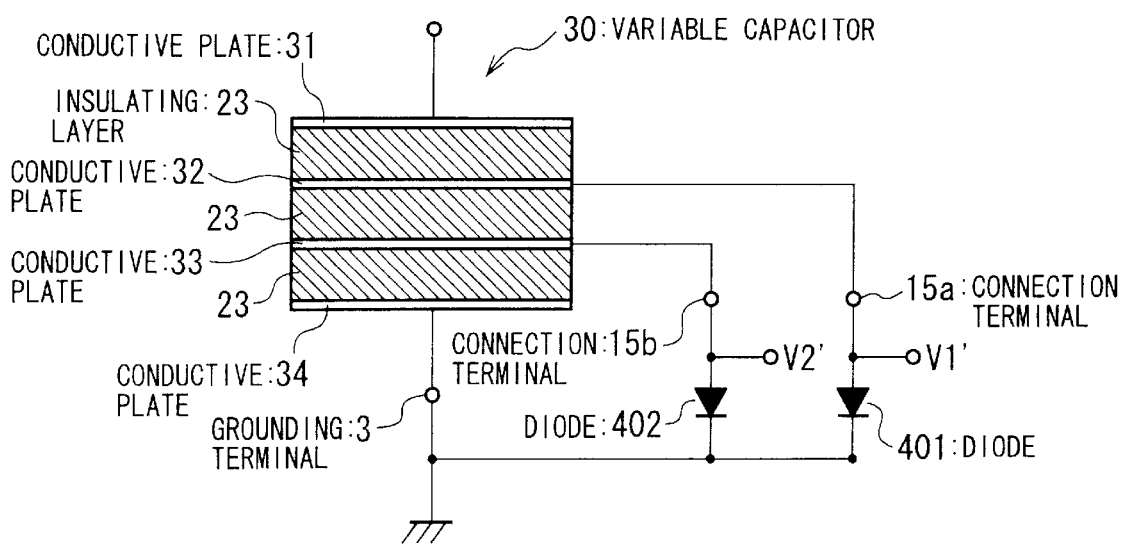
FIG. 15 is a cross-sectional view showing another application example of the variable capacitor of FIG. 2.

FIG. 15 shows an example in which diode are used as the switch elements SW1 and SW2 connected to the variable capacitor 30 of the first embodiment.

As shown in FIG. 15, the anode of the diode 401 is electrically connected to the conductive plate 32, and the cathode thereof is grounded. The anode of the diode 402 is electrically connected to the conductive plate 33, and the cathode thereof is grounded. The control voltages V1' and V2' are supplied to the anodes of the diodes 401 and 402.

If the control voltages V1' and V2' are made higher than the turn-on voltage of the diodes 401 and 402, the diodes 401 and 402 go into the conducting condition and the conductive plates 32 and 33 are grounded. If the control voltages V1' and V2' are made lower than the turn-on voltage of the diodes 401 and 402, however, the diodes 401 and 402 go into the non-conducting condition, so that the conductive plates 32 and 33 are placed in the electrically floating condition.

In this manner, by adjusting the control voltages V1' and V2', it is possible to control the conducting condition of the diodes 401 and 402, thereby permitting the capacitance C to be changed.

Variations

The present invention described above is the form of preferred embodiments, to which the present invention is not restricted. It will be understood that the present invention can take other forms and variations within the scope of the present invention.

For example, it is alternatively possible that the insulating layers (that is, dielectric layers) of the variable capacitors 30B, 30C, and 30D in the third, fourth, and fifth embodiments, respectively, be made of materials having differing dielectric constants.

Additionally, it is possible to appropriately combine a variable capacitor 30, 30A, 30B, 30C, or 30D of the first, second, third, fourth and fifth embodiments with a variable inductor,40 or 40A of the first and sixth embodiments in configuring the RF circuit module 100.

Although the RF circuit module 100 of the first embodiment has a variable capacitor 30 and a variable inductor 40, it is alternatively possible to replace one of these with a conventional reactance element (that is, with a fixed capacitor or fixed inductor). In this case, it is still possible to make a reversible change in the impedance of the output matching circuit 203.

Another possible alternative is that in which, rather than providing the switch elements SW1, SW2, SW1', and SW2' on the circuit mounting substrate, switch elements having the same type of function are provided on an RF circuit module 100.

As described in detail above, according to a variable capacitor of the present invention it is possible to make a reversible change in the capacitance, and also achieve compactness.

Similarly, according to variable inductor of the present invention, it is.possible to make a reversible change in the inductance, and also achieve compactness.

According to an RF circuit module of the present invention, it is not only possible to easily adjust for a deviation in impedance caused by manufacturing variation, but also to accommodate multiband and multimode operation, while providing a compact and low-cost module.

What is claimed is:

1. A variable capacitor comprising:
    a multilayer circuit board having a plurality of dielectric layers;
    a first conductive plate, provided within said multilayer circuit board, for serving as one electrode of said variable capacitor;
    a second conductive plate, provided within said multilayer circuit board, for serving as the other electrode of said variable capacitor;
    a plurality of third conductive plates provided between said first conductive plate and said second conductive plate; and
    a plurality of switching means provided for grounding said third conductive plates selectively.

2. A variable capacitor comprising:
    a multilayer circuit board having a plurality of dielectric layers;
    a first conductive plate, provided within said multilayer circuit board, for serving as one electrode of said variable capacitor;
    a second conductive plate, provided within said multilayer circuit board, for serving as the other electrode of said variable capacitor;
    a plurality of third conductive plates provided between said first conductive plate and said second conductive plate;
    a plurality of terminals provided on an outer surface of said multilayer circuit board;
    a plurality of via holes connecting said a plurality of third conductive plates and said a plurality of terminals, respectively; and
    a plurality of switching means provided for grounding said third conductive plates via said terminals selectively.

3. The variable capacitor according to claim 1, wherein said variable capacitor forming at least two capacitors, said two capacitors being connected in series.

4. The variable capacitor according to claim 1, wherein said variable capacitor forming at least two capacitors, said two capacitors being connected in parallel.

5. A variable inductor comprising:
    a multilayer circuit board having a plurality of dielectric layers;
    a first conductive plate, provided within said multilayer circuit board, for serving as a transmission line;
    a second conductive plate, provided within said multilayer circuit board, for serving as a grand plate of said transmission line;
    a third conductive plate, provided between said first conductive plate and second conductive plate, for serving as a grand plate of said transmission line; and
    a plurality of switching means provided for grounding either one of said second and said third conductive plates selectively.

6. A variable inductor comprising:
    a multilayer circuit board having a plurality of dielectric layers;
    a first conductive plate, provided within said multilayer circuit board, for serving as a transmission line;
    a second conductive plate, provided within said multilayer circuit board, for serving as a grand plate of said transmission line;
    a third conductive plate, provided between said first conductive plate and second conductive plate, for serving as a grand plate of said transmission line;
    a terminal provided on an outer surface of said multilayer circuit board; and
    a via hole connecting said third conductive plate and said terminal.

* * * * *